United States Patent [19]

Bilkadi et al.

[11] Patent Number: 4,568,598
[45] Date of Patent: Feb. 4, 1986

[54] ARTICLE WITH REDUCED FRICTION POLYMER SHEET SUPPORT

[75] Inventors: Zayn Bilkadi, St. Paul; William A. Hendrickson, St. Joseph Township, St. Croix County, both of Minn.

[73] Assignee: Minnesota Mining and Manufacturing Company, St. Paul, Minn.

[21] Appl. No.: 666,491

[22] Filed: Oct. 30, 1984

[51] Int. Cl.⁴ .......................... B32B 3/30; C23C 14/00
[52] U.S. Cl. ............................... 428/141; 204/192 E; 360/55; 427/129; 428/155
[58] Field of Search ...................... 428/141, 155, 336; 427/129; 204/192 E; 360/55

[56] References Cited

U.S. PATENT DOCUMENTS

| | | | |
|---|---|---|---|
| 3,900,604 | 8/1975 | Tanabe et al. | 427/129 |
| 3,967,025 | 6/1976 | Tanabe et al. | 428/155 |
| 4,064,030 | 12/1977 | Nakai et al. | 204/192 E |
| 4,097,650 | 6/1978 | Shirahata et al. | 428/336 |
| 4,153,920 | 6/1979 | Shirahata et al. | 360/55 |
| 4,155,826 | 6/1979 | Nakai et al. | 204/192 E |
| 4,233,352 | 11/1980 | Ono et al. | 428/141 |
| 4,340,276 | 7/1982 | Maffitt et al. | 204/192 E |

OTHER PUBLICATIONS

T. Morjuchi et al., Surface Properties of Sputter Etched Fluoropolymers, pp. 1501–1504, 1977.
S. Yamamoto et al., Tech. Research Laboratory, "New Surface Improvement Technique for PTFE Film", Sep.–Oct. 1982, pp. 39–42.

Primary Examiner—Thomas J. Herbert
Attorney, Agent, or Firm—Donald M. Sell; James A. Smith; Lorraine R. Sherman

[57] ABSTRACT

A reduced friction composite sheet construction comprises a semicrystalline polymeric sheet support having a first and second surface, said surfaces having in the range of 5 to 99 percent crystalline polymeric material and 1 to 95 percent amorphous polymeric material, said first surface having been subjected to sputter-etching which preferentially ablates said amorphous material compared to said crystalline material so as to provide on said first surface ridges or needles of amplitude in the range of 0.01 to 5.0 micrometers, and a separation at their apexes in the range of 0.01 to 1.0 micrometers and having an aspect ratio in the range of 0.5 to 7, said first surface having at least one of static and dynamic coefficients of friction in the range of 0.01 to 0.7, and at least one functional layer coated on said second surface of said support.

19 Claims, 8 Drawing Figures

ARTICLE WITH REDUCED FRICTION POLYMER SHEET SUPPORT

DESCRIPTION

1. Field of the Invention

The present invention relates to a composite article having a reduced friction polymeric sheet support and a method therefor. The polymeric sheet is useful as a support for a functional layer in a composite sheet construction.

2. Background of the Invention

Thin polymer films are used as backings for a variety of products such as photographic films, adhesive tapes, abrasive sheets, anti-reflective coatings and, in a most important area, for magnetic recording tape. In all these applications, the end product consists of a composite sheet construction comprising a polymer support coated with a functional layer. A common problem associated with any of the above uses involves large frictional forces encountered in the handling of the sheets both during manufacture and during final product use. The polymeric support characteristics play an important role in the "handling" or "runnability" of products.

The terms "handling" or "runnability" relate to the properties of a sheet as it is transported through any processing mechanism whether it be during film manufacture, coating or converting, or end-use, as for example through a magnetic tape recorder. In particular, handling or runnability has to do with the forces encountered in movement of the sheet: first, to unwind it from the jumbo or roll and, second, to move it over idler rolls and past stationary rolls and the like. For sheets without any treatment, these forces can be very large. The addition of a "slip" agent is commonly used to make the untreated sheet more slippery. Sometimes lubricants are used on the sheet but, for the most part, solid particles are added to the melt before the film is extruded.

It is known in the art to treat polymeric sheets so as to provide slip and a low coefficient of friction to the surface of a base sheet or film. The inclusion of particles, such as inert particles or polymer crystals, in a polymeric layer provides regions that slip over each other and provide a lower coefficient of friction. This causes a surface roughness dependent on particle size because the particles protrude from the film surface. The addition of these slip particles to the film, while achieving a lower friction coefficient, produces other problems. These particles protrude from both film surfaces and when the film is wound in a roll the particles press into, and sometimes through, any coating on the film. U.S. Pat. No. 4,233,352 teaches a polyester film made to have reduced coefficient of friction by adding "worm-like nodules" of other polymer to the surface of the polyester for use in magnetic tape. In the case of a magnetic tape coating, slip particles cause either a hole in the coating or, in the case of an indentation, a slightly different coating-to-head spacing, and both of these result in a signal loss or so-called "drop-out".

Use of a roughened surface but without use of particles has also been employed to provide good handling, i.e., low coefficient of friction, providing good slip characteristics. U.S. Pat. Nos. 3,900,604 and 3,967,025 disclose magnetic recording material with the polymeric base film having been thermally treated on one side only, then stretched to give a "finely rugged" surface on the annealed side which imparts good running properties, the second side being relatively smooth and coated with the magnetic media to give good magnetic properties. The fine ruggedness obtained by this heat/stretch treatment may be characterized as small irregularly distributed bumps corresponding to clustered crystallites on the heated surface.

U.S. Pat. Nos. 4,097,650 and 4,153,920 disclose a recording tape to provide improved output and signal to noise ratio by controlling the film surface roughness (as by chemical etching in alkali or by ion bombardment), the surface roughness of both surfaces of the film having a mean value of 0.1 micrometer or less.

In more recent years, sputter-etching of polymeric films has been taught but without reference to its use in controlling frictional properties. U.S. Pat. Nos. 4,064,030 and 4,155,826 disclose sputter-etching of a polymer film to provide a microstructured surface that promotes adhesion. U.S. Pat. No. 4,340,276 teaches preferential sputter-etching of the composite surface of a polymer sheet after discontinuous metal or metal oxide coating to provide an anti-reflection coating and good adhesion. In 1977 and 1982, papers were published by workers at Nitto Electric Industries, Japan, that indicated sputter-etched fluoropolymers (polytetrafluoroethylene) showed improved adhesion properties.

SUMMARY OF THE INVENTION

The present invention provides a composite sheet-like article comprising:

a. a semicrystalline polymeric sheet support having a first and second surface, said surfaces having in the range of about 5 to 99 percent crystalline polymeric material and 1 to 95 percent amorphous polymeric material, said first surface having been subjected to sputter etching which preferentially ablates said amorphous material compared to said crystalline material so as to provide on said first surface ridges, or needles of amplitude in the range of 0.01 to 5.0 micrometers, preferably 0.01 to 0.5 micrometer, and a separation at their apexes in the range of 0.01 to 1.0 micrometers, preferably 0.1 to 0.2 micrometer, and having an aspect ratio in the range of 0.5 to 7, said first surface having static and dynamic coefficients of friction in the range of 0.01 to 0.7, preferably 0.01 to 0.4, and most preferably 0.01 to 0.3, b. at least one functional layer coated on said second surface of said support.

The present invention provides for reduced friction between sheet materials, at least one of which is a polymeric sheet material, without use of lubricants or other additives. The method of the invention eliminates chemical slip agents and other additives that may either alter the performance of the polymer, create toxic hazards upon leaching, or be economically unattractive, etc.

Reduced friction polymeric sheet-like articles are desirable for all processes requiring such articles to be moved about or handled. This so-called "runnability" can be correlated to the coefficient of friction of the sheet surface. The coefficient of friction of a sheet material surface is a good measure of the unwind force of the roll of sheet material; that is, the lower the coefficient of friction the lower the unwind force. A sheet-like article with a coefficient of friction greater than about 0.7 is almost impossible to run on processing equipment because of the high driving forces required. A sheet-like article with a low coefficient of friction results in less force required to move the article against idlers and also results in less abrasion of the article as it is transported.

Surface treatment of polymers can be accomplished in a number of different ways including corona treatment, glow discharge, chemical etching, and sputter-etching. All of these techniques have been used to increase the adhesion to and the wetting of polymer surfaces. However, the first three processes have certain disadvantages. Corona treatment produces an unstable surface in that it is a transient effect, i.e., short lived. Glow discharge treatment may or may not provide a stable surface, but obtaining topographical modification of the surface requires a long treatment time. Chemical etching can cause pollution and handling problems.

By contrast, sputter-etching is a rapid and clean surface treatment method wherein there are no fire hazards, no need for disposing of waste solutions, and no concerns about spillage. Sputter-etching provides a roughened polymeric surface having lower static and dynamic coefficients of friction than the original smooth surface. It is a very clean and inexpensive method which serves the dual purpose of both cleaning the surface and roughening it to increase its slip. It is believed novel in the art to provide a composite sheet material having a support with a low friction surface achieved by means of sputter-etching of a semi-crystalline polymer.

The surprising discovery of this invention is that sputter-etching of the backside of a polymeric sheet support provides the support with a desirably low coefficient of friction, i.e., in the range of 0.01 to 0.7.

The reduced friction polymeric surfaces provided by the present invention allow thinner substrates and thinner functional layer coatings to be used. In the case of magnetic recording tape, this results in more tape in the same size cassette and thinner coatings with less defects.

Functional layers can be magnetic media, photographic emulsions, adhesives, anti-reflection coatings, organic photoconductors, abrasives, etc. These functional layers can have a thickness in the range of $1 \times 10^{-3}$ to $1 \times 10^2$ micrometers.

In the present invention:

"sputter-etching" means the bombardment of a surface with neutral species and ions, e.g., oxygen, argon, carbon dioxide, nitrogen, or helium ions; this term includes ion beam milling as well as radio-frequency (RF) sputtering;

"semicrystalline polymer" means a polymer containing two phases: a crystalline phase and an amorphous phase;

"static coefficient of friction", "$\mu_s$", is a measure of the force per unit area necessary to start or initiate movement of an object along a horizontal plane under pressure;

"dynamic coefficient of friction", "$\mu_d$", is a measure of the force per unit area necessary to keep an object moving along a horizontal plane under pressure;

"uniaxially oriented" means stretched in one direction;

"biaxially oriented" means stretched in two directions perpendicular to each other;

"surface" means the outer 10 nm of a polymeric sheet or film;

"stretch direction" means the direction in which a film has been elongated; if uniaxially stretched, the stretch direction is in the direction of extrusion of the film, also known as the machine direction; and "aspect ratio" means ratio of height to diameter (at half height) of an individual peak or in the case of a ridge, the aspect ratio is the ratio of height of a ridge to the width at half height.

DETAILED DESCRIPTION

The present invention sheet-like article comprises a semi-crystalline polymer having crystallinity in the range of 5 to 99 percent, preferably 20 to 90 percent and coated on at least one surface thereof a functional layer. Representative polymers useful in the present invention include semicrystalline polymers, examples of which are polyesters such as poly(ethylene terephthalate) (PET) and poly(butylene terephthalate); polyolefins such as polypropylene and polyethylene; polyamides such as Nylon 66; fluoropolymers such as polytetrafluoroethylene (PTFE); polyethers such as poly(methylene oxide); polyurethanes; and blends and copolymers thereof. Representative thickness of polymeric sheets is in the range of 2.5 to 250 micrometers.

When subjected to sputter-etching as described in the present invention, the treated surface (backside) of the polymeric sheet undergoes a reduction in friction. The surface exposed to sputter-etching need have no modification or additives.

Figure 1:
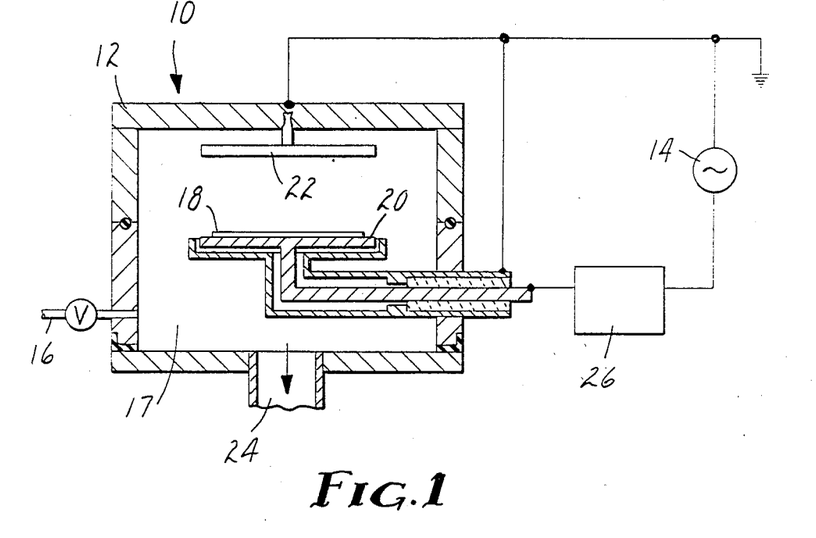
FIG. 1 is a schematic diagram of a sputter-etching discharge chamber.
Figure 2:
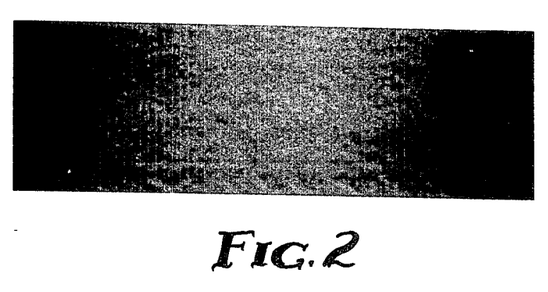
FIG. 2 is a scanning electron micrograph (SEM) ×30,000 of an untreated biaxially oriented poly(ethylene terephthalate) (PET) sheet material.

Sputter-etching to obtain a low friction polymer surface is effected using existing sputtering apparatus; for example, a discharge chamber is schematically shown in FIG. 1. The most important features of the apparatus 10 and procedure include a plasma (not shown) which is generated in housing 12 by a capacitive RF generator 14. Gas inlet 16 allows an appropriate gas such as $O_2$, Ar, $N_2$, or $CO_2$ to enter chamber 17 in which a vacuum has been created by means of exit port 24. Matching box 26 induction couples RF generator 14 to electrodes 20 and 22. A polymeric sheet 18 is placed directly on driven electrode 20 which is opposite electrode 22 which may be cooled by appropriate means (not shown). When the apparatus is operating, polymer sheet 18 is not inside the glowing region of the plasma (as is the case in conventional glow discharge treatments) but rather in the cathode "dark space". The ion energy in the cathode dark space is about 10 to 100 times greater than the ion energy inside the glow discharge itself.

Typically, the gas pressure inside the evacuated chamber is kept at $0.5 \times 10^{-3}$ to $20 \times 10^{-3}$ torr. The voltage drop across the electrodes is 0.4 to 1 KV at a frequency of 13.56 MHz. The discharge power is typically in the range of 0.06–0.50 watt/cm$^2$ (w/cm$^2$).

Figure 3:
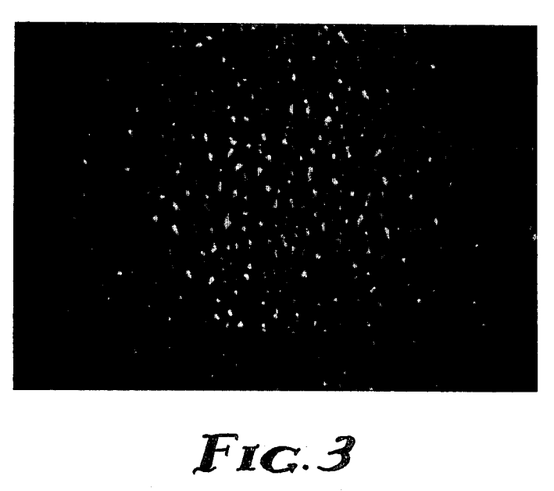
FIG. 3 is a SEM ×30,000 of a sputter-etched biaxially oriented PET film.
Figure 4:
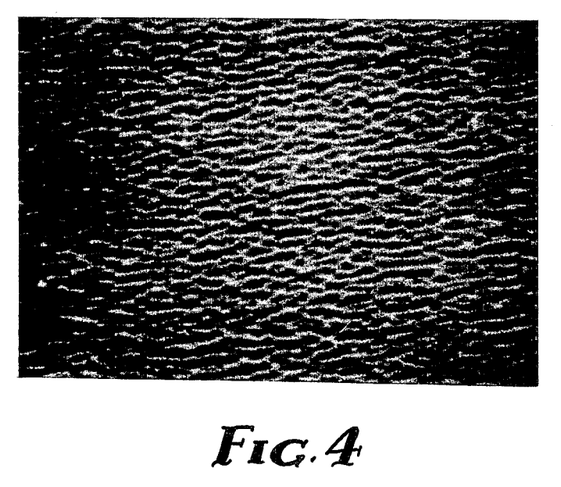
FIG. 4 is a SEM ×30,000 of a sputter-etched uniaxially oriented PET film.
Figure 5:
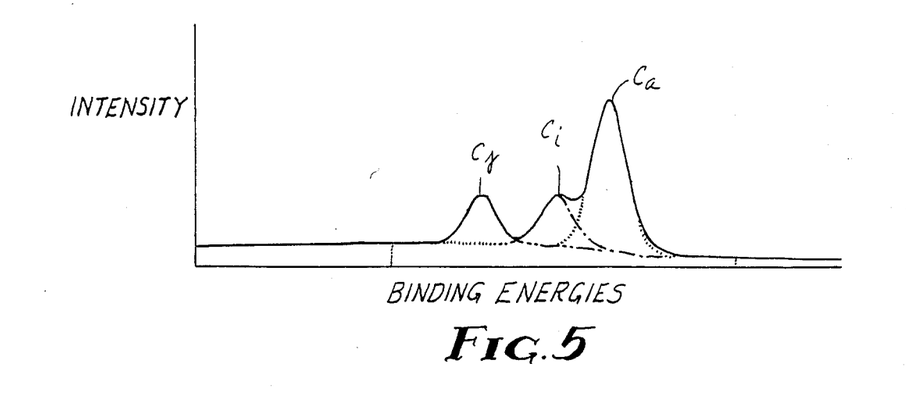
FIG. 5 is an X-ray photoelectron spectrum (XPS) of an untreated polyester film showing relative binding energies of the surface carbon atoms.
Figure 6:
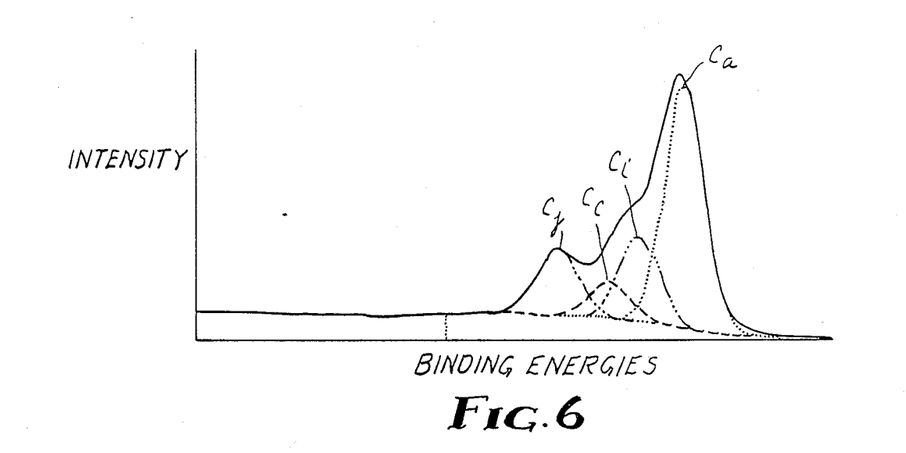
FIG. 6 is an XPS of a polyester film sputter-etched with an oxygen plasma.
Figure 7:
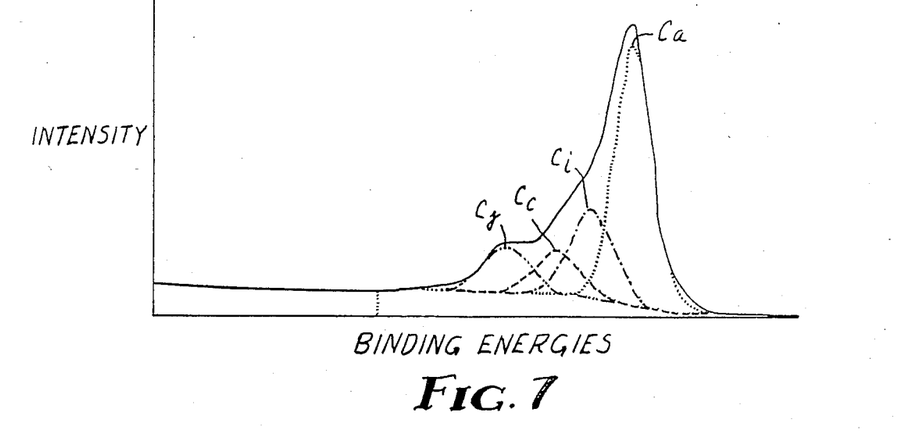
FIG. 7 is an XPS of a polyester film sputter-etched with a nitrogen plasma.
Figure 8:
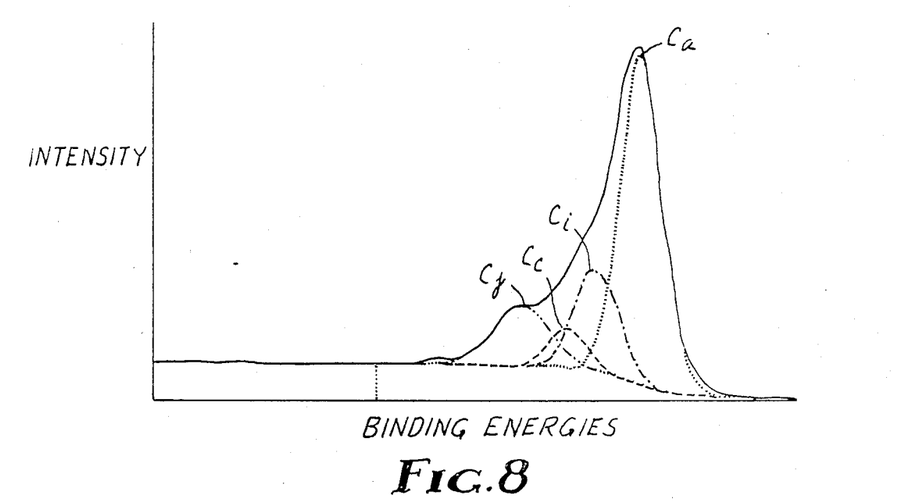
FIG. 8 is an XPS of a polyester film sputter-etched with an argon plasma.

The reduction in friction of the sputter-etched polymeric surface is accompanied by substantial changes in both the topography and chemical constitution of the surface. The topographical changes in the surface are believed to be unique to the sputter-etching treatment and due to the preferential etching that occurs with semi-crystalline polymer upon ion-bombardment whereby the amorphous portions are ablated away at a faster rate than the more ordered crystalline portions. In the cases of unoriented and biaxially oriented polymers this phenomenon leads to the development of a characteristic grass-like or needle-like microtexture on the surface where the stalks or needles can be identified (by X-ray diffraction for example) as partially ablated crystallites. These remaining crystallites, whose number and size depend ultimately on the degree of crystallinity of the polymer, form the elongated peaks shown in the scanning electron micrograph of FIG. 3. In the case of uniaxially oriented polymers the surface microstructure consists of parallel ridges oriented perpendicular (normal) to the stretch direction of the film as is shown in FIG. 4. In particular it is seen that one of the distinguishing features of the surface microtexture resulting from sputter-etching as compared to other treatments is the high aspect ratio, i.e., in the range of 0.5 to 7, preferably 1 to 5, of the micropeaks formed, as well as their high packing density, when the degree of crystallinity of the polymer is appreciable.

It is believed these hard micropeaks ride on each other, when two sputter-etched films of polymer are moved against each other, and the apparent decrease in contact area manifests itself as a lowering of the coefficient of friction. When a treated film is moved against an untreated surface a similar lowering of the coefficient of friction takes place. The coefficient of friction obtained for some polymers subjected to sputter-etching, such as the case with polyesters, often are below those obtained by other physical or chemical techniques including for example those disclosed in U.S. Pat. No. 3,900,604 wherein the differential crystallization of one surface of the film by heat treatment results in a finely rugged surface significantly different in topography and chemical identity from a sputter-etched surface.

The effect of sputter-etching is not solely limited to altering the microtexture of the surface, but involves, in addition, readily identifiable chemical changes within the outermost 10 nm of the polymer surface as revealed by surface spectroscopic techniques. These chemical changes, induced at least partially by free-radical generation in the plasma, appear to be inherent to the sputter-etching treatment and are of general applicability to all the polymers examined in this work.

The characterization of sputter-etched surfaces can be accomplished by various methods, the first of which is scanning electron microscopy. The typical appearance of both uniaxially and biaxially oriented polymers is shown in the attached micrographs (FIGS. 3 and 4). Both micrographs are at 30,000 magnification and were taken at 45° tilt of the sample. In general, for semicrystalline polymers, the sputter-etched surface is characterized by peaks or ridges which are believed to constitute centers of sputter resistance. That is, the less ordered or amorphous material in the interstitial spaces between the polymer crystallites were preferentially ablated.

When the polymer film is uniaxially stretched prior to sputter-etching the protruding grass-like peaks are not obtained initially. Instead, an intermediate striation pattern (ridges) is obtained characterized by more or less parallel rows of hard crystallites aligned more or less normal (perpendicular) to the stretch direction and alternating with interstitial non-crystalline regions. Further sputter-etching, however, eventually leads to break up of the crystallites conducive to formation of a needle-like microtexture except that the protruding needles are aligned in more or less parallel rows as in a brush. In all cases the depths of etching for any particular polymer is determined by discharge power, time of treatment, and the nature of the gas. By varying these parameters, peak heights in the range of 0.01 to 5.0, preferably 0.01 to 2.0 micrometers can be obtained.

A low film-on-film coefficient of friction is realized by sputter-etching one or both surfaces of a polymeric film. With the back surface treated, the film will unwind easily from its jumbo roll in production. Sputter-etching provides a reduced friction backside for improved handling throughout both manufacturing processes and end-use processes. Sputter-etched polymeric surfaces of the present invention have at least one of static and dynamic coefficients of friction in the range of 0.01 to 0.7, preferably 0.01 to 0.4, and most preferably 0.01 to 0.3.

The process of the present invention will produce, by sputter-etching with an oxygen plasma, a polymer surface with 50–85% carbon and 15–50% oxygen content in the surface. If nitrogen is used as a plasma, or a starting polymer with nitrogen incorporated therein is used, a 1–15% nitrogen content will also be present on the surface. If sputtering gases such as argon are used, both oxygen and nitrogen will be incorporated on the surface (due to contaminants in the gas, presence of oxygen in the original polymer, and reaction of the active surface with atmospheric gases). The preferred ratios for any plasma are 70–85% carbon, 10–30% oxygen and 0–10% nitrogen and the surface will contain four distinct types of carbon bonding (designated herein $C_a$, $C_c$, $C_i$, and $C_j$ and described in TABLE I below). It is to be understood that these specific types of carbon bonding are in or attached to a polymer backbone. Determination of polymer oxidation levels and carbon species in a polymer surface can most readily be accomplished by a surface analytical technique called X-ray Photoelectron Spectroscopy (XPS) or Electron Spectroscopy for Chemical Analysis (ESCA) (see for example the references "Polymer Surfaces", ed. D. T. Clark et al., John Wiley & Sons, NY (1978) and "Photon, Electron, and Ion Probes of Polymer Structure and Properties", ed. D. W. Dwight et al., ACS Symposium Series 162, American Chemical Society, Washington, D.C. (1981)). Sputter-etched surfaces contain at least 4 atomic percent more oxygen than the bulk polymer. This can be shown by comparison of XPS analysis of the sputtered surface to conventional combustion analysis of the bulk. Determination of surface atomic ratios and chemical makeup of the surface of a sample by the XPS method of analysis is accomplished by bombarding the sample with monochromatic soft X-rays and analyzing the intensity and energies of the emitted core level electrons. These types of carbon can be designated $C_a$, $C_b$, $C_c$, $C_d$, $C_e$, $C_f$, $C_g$, and $C_h$ and refer to chemical functionalities shown in TABLE I below.

TABLE I

XPS Carbon Types

| XPS designation | Carbon types | X | Representative examples |
|---|---|---|---|
| $C_a$ | X–C(X)(X)–X (X top, X bottom, X right) | C, H | cyclohexane, 2-pentyne |
| $C_b$ | X–C(X)(X)–O–X | C, H | methanol, dimethylether |
| $C_c$ | X–C=O | C, H | acetone, formaldehyde |
| $C_d$ | X–C(=O)–O–X | C, H | acid or ester carbon in dibutylphthalate |
| $C_e$ | X–C(X)(X)–N(X)–X | C, H | methylamine |
| $C_f$ | X–C(X)=N–X | C, H | unsaturated carbon in acetoxime |
| $C_g$ | X–C≡N | C | acetonitrile |
| $C_h$ | X–C(=O)–N(X)–X | C, H | carbons bonded to both O and N in phthalimide |
| $C_i$ | combination of one or more of $C_b$, $C_e$, $C_f$, and $C_g$ | | |
| $C_j$ | combination of one or more of $C_d$, $C_h$ | | |

FIGS. 5, 6, 7 and 8 show XPS tracings of untreated polyester film, and polyester film sputter-etched with oxygen, nitrogen, and argon gases, respectively. The areas under each curve are proportional to the relative amount of the particular carbon bonding present on the surface. This information is shown in TABLE II below where different carbon types observed on the surface and their relative contributions as a result of sputter-etching in three different gases is given.

Note that in all cases four peaks corresponding to $C_a$, $C_i$, $C_c$, and $C_j$ exist for the treated polyester films. Similar results are obtained for other films such as polypropylene, polyethylene, poly(methylene oxide), Nylon 66, polystyrene, and the like.

It must be pointed out that direct observation of carbons $C_a$ to $C_j$ in a single spectrum may be difficult due to overlapping of the signals and therefore the data analysis is done by computer.

Distribution of relative amounts of $C_a$, $C_c$, $C_i$, $C_j$ may be quite broad with each peak being at least 0.2% of the total carbon region of the spectra and not more than 75%. Preferably $C_a$ is in the range of 20-70%, $C_i$ is in the range of 10-40%, $C_c$ is in the range 2-60%, and $C_j$ is in the range 3-25%. Most preferably $C_a$ is in the range of 40-70%, $C_i$ is in the range of 15-30%, $C_c$ is in the range 5-20%, and $C_j$ is in the range ob 4-20%.

TABLE II

Percent Surface Carbon Bonds on Polymeric Films with various Plasma Treatments

| Polymer | $C_a$ | $C_i$ | $C_c$ | $C_j$ |
|---|---|---|---|---|
| polyester (untreated) | 63.6 | 19.8 | 0 | 16.6 |
| polyester (O₂) | 56.1 | 19.9 | 8.7 | 15.3 |
| polyester (N₂) | 55.7 | 22.2 | 10.8 | 11.3 |
| polyester (Ar) | 59.3 | 19.5 | 6.4 | 14.7 |
| polystyrene (untreated) | 100 | 0 | 0 | 0 |
| polystyrene (O₂) | 63.2 | 23.9 | 8.4 | 4.9 |
| Delrin ® (untreated) (poly(methylene oxide), Dupont Corp.) | 18.2 | 11.5 | 70.3 | 0 |
| Delrin ® (O₂) | 20.4 | 14.8 | 53.7 | 11.0 |
| Delrin ® (Ar) | 34.7 | 23.1 | 31.0 | 11.2 |
| Delrin ® (N₂) | 38.5 | 20.2 | 32.3 | 8.8 |
| Nylon 66 (untreated) | 50.0 | 34.8 | 0 | 15.2 |
| Nylon 66 (O₂) | 48.2 | 26.5 | 5.3 | 19.8 |
| Nylon 66 (Ar) | 54.1 | 27.2 | 9.1 | 9.6 |
| Nylon 66 (N₂) | 53.1 | 21.0 | 8.2 | 17.8 |
| polyethylene (untreated) | 100 | 0 | 0 | 0 |
| polyethylene (O₂) | 44.6 | 27.3 | 12.1 | 15.9 |
| polyethylene (Ar) | 54.7 | 23.5 | 11.4 | 10.4 |
| polyethylene (N₂) | 58.4 | 27.6 | 8.1 | 5.9 |
| polypropylene (untreated) | 100 | 0 | 0 | 0 |
| polypropylene (O₂) | 56.8 | 20.0 | 14.2 | 8.9 |
| polypropylene (Ar) | 56.0 | 25.1 | 8.5 | 10.4 |
| polypropylene (N₂) | 53.3 | 27.6 | 11.4 | 7.7 |

Another characterization measurement of interest to the present invention is coefficient of friction of the polymer surface. This measurement is carried out using a modified ASTM D 1894 (1981) standard and involves attaching the sample to a 200 gram hemicylindrical sled riding on a second horizontal surface (which may be more sample) at a constant rate of speed of 12.7 cm (5 inches) per minute pulled by a Universal Testing machine Model TT (Instron Engineering Corp., Canton, MA). Both static and dynamic coefficients can be measured.

The reduced friction polymer film made according to this invention can be combined with different functional layers to form various products. As an example, a sputter-etched biaxially oriented PET film, combined with a layer of magnetic media, forms an easily-handleable, low-abrasion, and low-drop-out magnetic recording tape. The present invention also provides a base for photographic films, adhesive tapes, abrasive sheets, and anti-reflective coatings.

Objects and advantages of this invention are further illustrated by the following examples, but the particular materials and amounts thereof recited in these examples, as well as other conditions and details, should not be construed to unduly limit this invention.

EXAMPLE 1

A low-friction polyester sheet surface was prepared by processing a biaxially oriented PET sheet of 0.0014 cm (0.00056 inch) thickness. The sheet was biaxially oriented in a (3/3) ratio, meaning it was stretched three times normal in both the machine direction and the cross web direction. The equipment consisted of an Ultech ™ Model 2400 radio frequency diode sputtering apparatus (Perkin Elmer, Palo Alto, CA) operating at a frequency of 13.56 MHz, modified to include an automatic impedance matching network. The apparatus included two substantially parallel, shielded, water cooled aluminum electrodes with a 5 cm (2 inch) gap between them. The electrodes were housed in a bell jar provided with RF shielding. The bell jar was evacuated to about $1 \times 10^{-5}$ torr and oxygen gas introduced through a needle valve at a flow rate of 80 standard cubic centimeters per minute (SCCM). An equilibrium pressure in the range of 5 to $8 \times 10^{-4}$ torr was maintained as oxygen was continuously introduced and pumped through the system. RF energy was capacitively coupled to the cathode, initiating a plasma. The energy input was set to a power density of about 0.06 watt/cm$^2$, thus causing the polymer sheet to be sputtered at the surface as positive ions from the plasma were accelerated toward the cathode and impinged on the sample to etch it. Treatment time was one minute. Using this apparatus, the etching time, gas pressure, and radiofrequency power were independently adjustable. Upon completion of the treatment the sheet was removed from the apparatus and the following information was noted and recorded.

An SEM analysis showed the microstructured surface of this polyester sheet. The microstructured topography could generally be described as a plurality of randomly positioned peaks, a predominant number of which ranged in height between 0.01 and 0.02 micrometers and had an aspect ratio between 2 and 3 and an average peak to peak distance of 0.015 micrometer. XPS analysis of the surface gives the spectrum shown in FIG. 6 where peaks corresponding to $C_a$, $C_i$, $C_c$, and $C_j$ can be observed within the composition ratio disclosed above.

Coefficient of friction measurements were made as per ASTM D-1894 (1981) except for the sled which carried the sample. The sled was a 200 g hemicylindrical body with a radius of 2.86 cm (1.13 inches) and a width of 2.86 cm (1.13 inches). The sample size was thus 8.9 cm (3.5 inches) by 2.86 cm (1.13 inches). The sled was pulled in such a fashion that the flat bottom of the hemicylindrical portion was in contact with the base platform.

An 8.9 cm by 2.86 cm treated polyester film sample was attached to the sled and the sled placed on two 5.08 by 25.4 cm (2×10 inch) film samples (one treated, one untreated) attached to the horizontal platform of an Instron TM testing machine. The sled movement rate was set at 12.7 cm/minute (5 inches/minute).

The static or starting coefficient of friction, $\mu_s$, the dynamic or moving coefficient of friction, $\mu_d$, were measured for treated film moving on untreated film and found to be 0.45 and 0.43 respectively and for treated film moving on treated film were found to be 0.40 and 0.45 respectively. The experimental error of measurement in this example and all of the following examples is estimated to be ±0.07 for the static coefficients of friction and ±0.02 for the dynamic coefficients of friction. The observed values of the static coefficients tend to be slightly more erratic than the dynamic coefficients because they were not averaged over a period of time. The low-friction sheet thus formed can be used as a support in a construction comprising a magnetic recording medium. Such a medium and method are disclosed, for example, in U.S. Pat. No. 4,156,037, Examples 1 through 8.

EXAMPLE 2

Biaxially oriented (3/3) PET film of 0.0014 cm (0.00056 inch) thickness was treated as in EXAMPLE 1 for 5 minutes. SEMs showed a plurality of random peaks which range in height from 0.02 to 0.03 micrometers and had an aspect ratio between 3 and 4 and an average peak to peak distance of 0.025 micrometers. Coefficient of friction measurements showed $\mu_s$ and $\mu_d$ to be 0.40 and 0.47 for treated film on untreated film and 0.40 and 0.40 for treated film on treated film. XPS analysis of the surface gives a spectrum similar to that shown in FIG. 6 with peaks corresponding to $C_a$, $C_i$, $C_c$, and $C_j$ within the composition ratio disclosed above. The low-friction sheet thus formed can be used as a support in a photogrpahic construction comprising a light-sensitive emulsion. Such an emulsion and coating method are disclosed, for example, in U.S. Pat. No. 3,320,069 and Egan, F. *Paper Trade J.*, 121, No. 17, 49 (1945).

EXAMPLE 3

Biaxially oriented (3/3) PET film of 0.0014 cm (0.00056 inch) thickness was treated as in EXAMPLE 1 for 20 minutes. SEMs showed a plurality of random peaks which ranged in height from 0.05 to 0.1 micrometers and had an aspect ratio between 3 and 4 and an average peak distance of 0.066 micrometer. Coefficient of friction measurements showed $\mu_s$ and $\mu_d$ to be 0.40 and 0.45 for treated film on untreated film and 0.25 and 0.25 for treated film on treated film. XPS analysis of the surface gives a spectrum similar to that shown in FIG. 6 with peaks corresponding to $C_a$, $C_i$, $C_c$, and $C_j$ within the composition ratio disclosed above.

EXAMPLE 4

Uniaxially oriented (3.8/1) PET film of 0.0014 cm (0.00056 inch) thickness was treated as in EXAMPLE 1 for 5 minutes using a Veeco TM Model 776 radio frequency sputtering apparatus (Veeco Instruments, Inc., Sunnyvale, CA) operating at 0.24 watts/cm$^2$ power density. This diode sputtering apparatus operated at a frequency of 13.56 MHz and was equipped with a variable impedance matching network. The aluminum water cooled electrodes were separated by a 6.25 cm (2.5 inch) gap. SEMs showed a plurality of parallel striations. Coefficient of friction measurements showed $\mu_s$ and $\mu_d$ to be 0.68 and 0.49 for treated film on treated film measured in the machine direction.

The topography could generally be described as a series of ridges and valleys with a height between 0.05 and 0.06 micrometer and spacings between 0.03 and 0.06 micrometer. XPS analysis of the surface gives a spectrum similar to that shown in FIG. 6 with peaks corresponding to $C_a$, $C_i$, $C_c$, and $C_j$ within the composition ratio disclosed above.

EXAMPLE 5

Biaxially oriented (3/3) PET film of 0.010 cm (0.004 inches) thickness was treated as in EXAMPLE 4 for 5 minutes. SEMs showed a plurality of random peaks which ranged in height from 0.02 to 0.03 micrometers and had an aspect ratio between 3 and 4 and an average peak to peak distance of 0.02 micrometers. Coefficient of friction measurements showed $\mu_s$ and $\mu_d$ to be 1.14 and 0.53 for treated film on untreated film and $\mu_s$ and $\mu_d$ to be 0.36 and 0.36 for treated film on treated film. XPS analysis of the surface gives a spectrum similar to that shown in FIG. 6 with peaks corresponding to $C_a$, $C_i$, $C_c$, and $C_j$ within the composition ratio disclosed above.

EXAMPLE 6

Biaxially oriented (3/3) Nylon 66 film of 0.010 cm (0.004 inches) thickness was treated as in EXAMPLE 4 for 1.2 minutes. SEMs showed a plurality of random peaks which ranged in height from 0.03 to 0.10 micrometer and had an aspect ratio between 1 and 5 and an average peak to peak distance of 0.3 micrometer. Coefficient of friction measurements showed $\mu_s$ and $\mu_d$ to be 0.41 and 0.42 for treated film on treated film. XPS analysis of the surface gives a spectrum similar to that shown in FIG. 7 with peaks corresponding to $C_a$, $C_i$, $C_c$, and $C_j$ within the composition ratio disclosed above.

EXAMPLE 7

Biaxially oriented (3/3) Nylon 66 film of 0.010 cm (0.004 inches) thickness was treated as in EXAMPLE 4 for five minutes. SEMs showed a plurality of random peaks which ranged in height from 0.03 to 0.20 micrometer and had an aspect ratio between 2 and 3 and an average peak to peak distance of 0.3 micrometer. Coefficient of friction measurements showed $\mu_s$ and $\mu_d$ to be 0.38 and 0.32 for treated film on treated film. XPS analysis of the surface gives a spectrum similar to that shown in FIG. 7 with peaks corresponding to $C_a$, $C_i$, $C_c$, and $C_j$ within the composition ratio disclosed above.

EXAMPLE 8

Biaxially oriented (3/3) poly(butylene terephthalate) (PBT) film of 0.010 cm (0.004 inches) thickness was treated as in EXAMPLE 4 for one minute. SEMs showed a plurality of random peaks which ranged in height from 0.01 to 0.02 micrometer and had an aspect ratio between 2 and 4 and an average peak to peak distance of 0.03 micrometers. Coefficient of friction measurements showed $\mu_s$ and $\mu_d$ to be 0.38 and 0.40 for treated film on treated film. XPS analysis of the surface gives a spectrum similar to that shown in FIG. 6 with peaks corresponding to $C_a$, $C_i$, $C_c$, and $C_j$ within the composition ratio disclosed above.

EXAMPLE 9

Biaxially oriented (3/3) PBT film of 0.010 cm (0.004 inches) thickness was treated as in EXAMPLE 4 for 5 minutes. SEMs showed a plurality of random peaks which ranged in height from 0.02 to 0.06 micrometer and had an aspect ratio between 3 and 4 and an average peak to peak separation distance of 0.05 micrometer. Coefficient of friction measurements showed $\mu_s$ and $\mu_d$ to be 0.40 and 0.40 for treated film on treated film. XPS analysis of the surface gives a spectrum similar to that shown in FIG. 6 with peaks corresponding to $C_a$, $C_i$, $C_c$, and $C_j$ within the composition ratio disclosed above.

EXAMPLE 10

Biaxially oriented (3/3) PBT film of 0.010 cm (0.004 inches) thickness was treated as in EXAMPLE 4, except with argon instead of oxygen gas in the apparatus chamber, for 10 minutes. SEMs showed a plurality of random peaks which ranged in height from 0.01 to 0.03 micrometer and had an aspect ratio between 4 and 5 and an average separation distance of 0.07 micrometer. Coefficient of friction measurements showed $\mu_s$ and $\mu_d$ to be 0.60 and 0.55 for treated film on treated film. XPS analysis of the surface gives a spectrum similar to that shown in FIG. 8 with peaks corresponding to $C_a$, $C_i$, $C_c$, and $C_j$ within the composition ratio disclosed above.

TABLE III below summarizes the coefficient of friction measurements of the examples. The numbers after the film name indicate the orientation ratios; thus, biaxial PET 3/3 indicates a PET film oriented three times its normal extruded dimensions in both the machine direction and the cross web direction. The number in parenthesis after the film type indicates the treatment time in minutes; thus, PET (5)/PET (5) indicates the coefficient of friction was measured for PET sliding on PET, both samples having been treated for five minutes.

TABLE III

| | | Friction data | | |
|---|---|---|---|---|
| Example | System | Gas | s | d |
| Biaxial PET (3/3), 0.0014 cm, 0.06 w/cm² | | | | |
| Reference | PET(0)/PET(0) | | 1.40 | 0.76 |
| 1 | PET(0)/PET(1) | $O_2$ | 0.45 | 0.43 |
| | PET(1)/PET(1) | $O_2$ | 0.40 | 0.45 |
| 2 | PET(0)/PET(5) | $O_2$ | 0.40 | 0.47 |
| | PET(5)/PET(5) | $O_2$ | 0.40 | 0.40 |
| 3 | PET(0)/PET(20) | $O_2$ | 0.40 | 0.45 |
| | PET(20)/PET(20) | $O_2$ | 0.25 | 0.25 |
| Unaxial PET (3.8/1), 0.0014 cm, 0.24 w/cm² | | | | |
| Reference | PET(0)/PET(0) | | 4.85 | NM* |
| 4 | PET(5)/PET(5) | $O_2$ | 0.68 | 0.49 |
| Biaxial PET (3/3), 0.010 cm, 0.24 w/cm² | | | | |
| Reference | PET(0)/PET(0) | | 1.40 | 0.76 |
| 5 | PET(0)/PET(5) | $O_2$ | 1.14 | 0.53 |
| | PET(5)/PET(5) | $O_2$ | 0.36 | 0.36 |
| Biaxial Nylon 66 (3/3), 0.010 cm, 0.24 w/cm² | | | | |
| Reference | Nylon(0)/Nylon(0) | | 0.55 | 0.55 |
| 6 | Nylon(1.2)/Nylon(1.2) | $O_2$ | 0.41 | 0.42 |
| 7 | Nylon(5)/Nylon(5) | $O_2$ | 0.38 | 0.32 |
| BIAXIAL PBT (3/3), 0.010 cm, 0.24 w/cm² | | | | |
| Reference | PBT(0)/PBT(0) | | 4.6 | 2.1 |
| 8 | PBT(1)/PBT(1) | $O_2$ | 0.38 | 0.40 |
| 9 | PBT(5)/PBT(5) | $O_2$ | 0.40 | 0.40 |
| 10 | PBT(10)/PBT(10) | Ar | 0.60 | 0.55 |

*The dynamic coefficient of friction for uniaxially oriented PET is labeled NM for not measured. This was due to a slip-stick motion of the sample sled while attempting the measurement, which was caused by the very high value for the coefficient of friction.

A number of observations can be made from the table. Most of the treatment took place in the first minute of sputter-etching. Oxygen was a more efficient sputter gas than argon. Sputter-etch treatment was most effective in reducing the coefficient of friction for sheets which had the highest untreated coefficient of friction (C.F.). Thus, PET which has one of the highest C.F. for any polymer film also shows the greatest benefit from sputter-etching. Nylon 66, which has a low C.F. shows a relatively small decrease in C.F. due to sputter etching.

Various modifications and alterations of this invention will become apparent to those skilled in the art without departing from the scope and spirit of this invention, and it should be understood that this invention is not to be unduly limited to the illustrative embodiments set forth herein.

We claim:
1. A composite sheet-like article having a reduced friction backside comprising:
   a. a semicrystalline polymeric sheet support having a first and second surface, said surfaces having in the range of 5 to 99 percent crystalline polymeric material and 1 to 95 percent amorphous polymeric material, said first surface having been subjected to sputter etching which preferentially ablates said amorphous material compared to said crystalline material so as to provide on said first surface ridges, or needles of amplitude in the range of 0.01 to 5.0 micrometers, and a separation at their apexes in the range of 0.01 to 1.0 micrometers and having an aspect ratio in the range of 0.5 to 7, said first surface having at least one of static and dynamic coefficients of friction in the range of 0.01 to 0.7, and
   b. at least one functional layer coated on said second surface of said support.

2. The article according to claim 1 wherein said semicrystalline polymeric sheet support is polyester, polyolefin, polyamide, fluoropolymer, polyether, polyurethane, and blends or copolymers thereof.

3. The article according to claim 1 wherein said ridges or needles have an amplitude in the range of 0.01 to 2.0 micrometers.

4. The article according to claim 1 wherein said ridges or needles have a separation at their apexes in the range of 0.01 to 0.5 micrometer.

5. The article according to claim 1 wherein said first surface has at least one of static and dynamic coefficients of friction in the range of 0.01 to 0.4.

6. The article according to claim 1 wherein said first surface has at least one of static and dynamic coefficients of friction in the range of 0.01 to 0.3.

7. The article according to claim 1 wherein said functional layer is a photographic emulsion, magnetic layer, an adhesive layer, an abrasive layer, an anti-reflective layer, or an organic photoconductor.

8. The article according to claim 1 wherein said functional layer is a photographic emulsion or a magnetic layer.

9. The article according to claim 1 wherein said sheet is a magnetic recording tape.

10. The article according to claim 1 wherein said sheet is a pressure sensitive adhesive tape.

11. The article according to claim 1 wherein said sheet is a photographic film.

12. The article according to claim 1 wherein said sputter-etched surface as shown by XPS comprising four different types of surface carbon bonding designated $C_a$, $C_i$, $C_c$, and $C_j$, each type being present in the range of 0.2 to 75 percent of total carbon.

13. The article according to claim 12 wherein the four different types of surface carbon bonding designated $C_a$, $C_i$, $C_c$, and $C_j$ are present in the range of 20 to 70 percent, 10 to 40 percent, 2 to 60 percent, and 3 to 25 percent, respectively.

14. The article according to claim 12 wherein the four different types of surface carbon bonding designated $C_a$, $C_i$, $C_c$, and $C_j$ are present in the range of 40 to 70, 15 to 30, 5 to 20, and 4 to 20 percents, respectively.

15. A method for using the article of claim 1 for recording information.

16. A method for making a reduced friction composite sheet-like article comprising the steps of:
   a. providing a semicrystalline polymeric sheet support having a first and second surface, said surfaces having in the range of 5 to 99 percent crystalline polymeric material and 1 to 95 percent amorphous polymeric material,
   b. subjecting said first surface to sputter etching so as to preferentially ablate said amorphous material compared to said crystalline material so as to provide on said first surface ridges or needles of amplitude in the range of 0.01 to 5.0 micrometers, and a separation at their apexes in the range of 0.01 to 1.0 micrometers and having an aspect ratio in the range of 0.5 to 7, said first surface having at least one of static and dynamic coefficients of friction in the range of 0.01 to 0.7, and
   c. coating at least one functional layer on said second surface of said support.

17. The method according to claim 16 wherein said sputter-etched surface as shown by XPS comprising four different types of surface carbon bonding designated $C_a$, $C_i$, $C_c$, and $C_j$, each type present being in the range of 0.2 to 75 percent of total carbon.

18. The method according to claim 16 wherein the four different types of surface carbon bonding designated $C_a$, $C_i$, $C_c$, and $C_j$ are present in the range of 20 to 70 percent, 10 to 40 percent, 2 to 60 percent, and 3 to 25 percent, respectively.

19. The method according to claim 16 wherein the four different types of surface carbon bonding designated $C_a$, $C_i$, $C_c$, and $C_j$ are present in the range of 40 to 70, 15 to 30, 5 to 20, and 4 to 20 percent, respectively.

* * * * *